(12) United States Patent
Loughmiller

(10) Patent No.: US 6,448,756 B1
(45) Date of Patent: Sep. 10, 2002

(54) DELAY LINE TAP SETTING OVERRIDE FOR DELAY LOCKED LOOP (DLL) TESTABILITY

(75) Inventor: Daniel R. Loughmiller, Boise, ID (US)

(73) Assignee: Micron Technology, Inc., Boise, ID (US)

(*) Notice: Subject to any disclaimer, the term of this patent is extended or adjusted under 35 U.S.C. 154(b) by 20 days.

(21) Appl. No.: 09/650,552

(22) Filed: Aug. 30, 2000

(51) Int. Cl.[7] .................................................. H03L 7/06
(52) U.S. Cl. .................. 324/76.54; 327/158; 324/158.1
(58) Field of Search ............................. 324/765, 158.1, 324/76.54, 712, 617

(56) References Cited

U.S. PATENT DOCUMENTS

| 4,805,195 | A | * | 2/1989 | Keegan | 375/106 |
|---|---|---|---|---|---|
| 5,781,055 | A | * | 7/1998 | Bhagwan | 327/270 |
| 5,796,673 | A | * | 8/1998 | Foss et al. | 365/233 |
| 5,940,608 | A | * | 8/1999 | Manning | 395/558 |
| 6,069,507 | A | * | 5/2000 | Shen et al. | 327/156 |
| 6,255,880 | B1 | * | 7/2001 | Nguyen | 327/277 |
| 6,297,680 | B1 | * | 10/2001 | Kondo | 327/278 |

* cited by examiner

Primary Examiner—N. Le
Assistant Examiner—Vincent Q. Nguyen
(74) Attorney, Agent, or Firm—Schwegman, Lundberg, Woessner & Kluth, P.A.

(57) ABSTRACT

An integrated circuit having a delay locked loop (DLL) connected to a test circuit. The DLL includes a plurality of taps connected to a plurality of register cells. The test circuit is capable of enabling any register cell to select a tap to test the DLL.

36 Claims, 12 Drawing Sheets

DELAY LINE TAP SETTING OVERRIDE FOR DELAY LOCKED LOOP (DLL) TESTABILITY

TECHNICAL FIELD OF THE INVENTION

The present invention relates generally to integrated circuits, and in particular to testing of integrated circuits.

BACKGROUND OF THE INVENTION

Delay locked loops (DLL) are often used in integrated circuits (IC) to generate an internal clock signal from an external clock. The internal clock usually has the same frequency with the external clock. Though they have the same frequency, the internal clock is preferable because it is more controllable. The internal clock is also more accurate and matches the operating condition of the IC better than the external clock.

There are different types of DLL. One type of DLL has a delay line for receiving an external clock at one end and producing an internal clock at another end. The delay line is controlled by a controller such as a shift register. The shift register connects to the delay line via a plurality of taps portioned along the delay line. Each of the taps has an equal predetermined amount of delay. The shift register automatically chooses the taps such that once the external clock enters the delay line, the internal clock is generated and has the same frequency with the external clock.

To ensure that the DLL performs properly, the taps of the DLL must be tested. Conventionally, a range of frequency settings is selected to test a corresponding group of taps. The taps at both ends of the group of taps may pass the test, but it is impossible to know if each of the taps in between was used by the DLL during the test. Therefore, there may be a tap that is defected but was not detected by the test.

It is possible to choose a clock frequency in an attempt to test a specific tap. But it is not guaranteed if the specific tap was utilized or tested. The DLL may have used another tap adjacent to the specific tap. This is because each time the DLL operates, the operating condition may change due to changes in variables such as temperature, voltage supply or other process variations within the DLL.

Therefore there is a need for a technique to test a DLL more accurately and more efficiently.

SUMMARY OF THE INVENTION

The problems associated with testing DLL and other problems are addressed by the present invention and will be understood by reading the following disclosure. A tap setting override for delay locked loop testability is provided which accurately and efficiently tests delay line taps of a DLL.

In one aspect, an integrated circuit is provided. The integrated circuit includes a delay locked loop (DLL) connected to a test circuit. The DLL includes a plurality of taps connected to a plurality of register cells. The test circuit is capable of enabling any register cell to select a tap to test the DLL.

In another aspect, a method of testing a delay locked loop is provided. The method includes activating a testmode signal. The method also includes activating a bypass signal to cause the shift register to bypass shifting signals from a phase detector. The method further includes decoding a plurality of input signals to produce a tap position signal and enabling the shift register to select a tap based on the tap position signal to test the DLL.

DETAILED DESCRIPTION OF THE INVENTION

The following detailed description of the embodiments of the invention refers to the accompanying drawings which form a part hereof, and shows by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
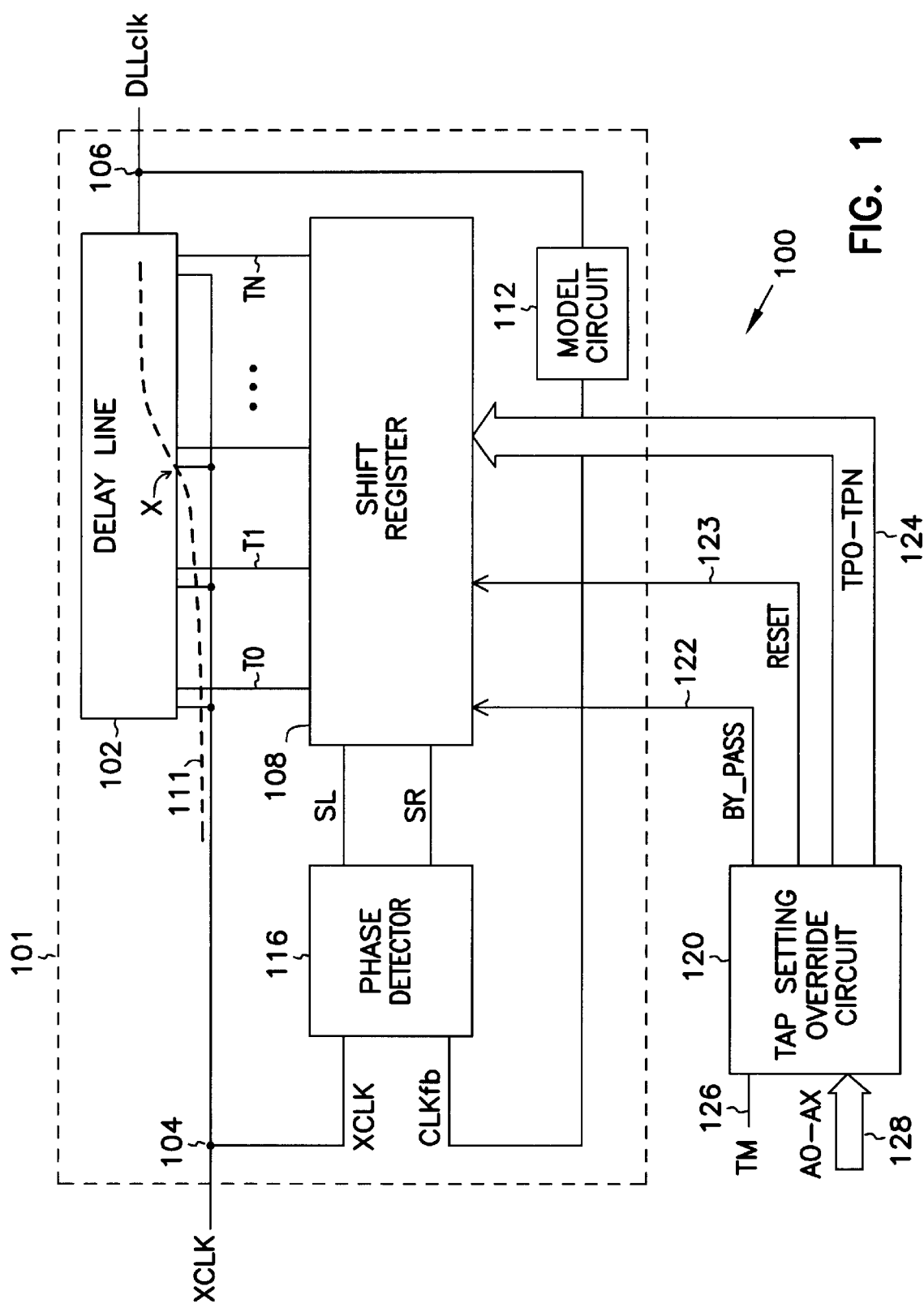
FIG. 1 illustrates block diagram of an integrated circuit having a DLL and a test circuit according to one embodiment of the invention.

FIG. 1 illustrates a block diagram of an integrated circuit 100 having a DLL 101 and a test circuit 120 according to the invention. In the Figure, DLL 101 includes a delay line 102 connected to receive an external input clock signal XCLK at a node 104 and produce an internal clock signal (DLLclk) at a node 106. A shift register 108 is connected to delay line 102 via a plurality of taps (T0–TN). A model circuit 112 is connected to receive DLLclk signal for producing a feedback signal CLKfb. A phase detector 116 is included in DLL 101. Phase detector 116 receives and compares XCLK and CLKfb signals to produce shifting signals, shift right (SR) and shift left (SL). The SR and SL are transmitted to the shift register and used by the shift register to select the taps. In addition, integrated circuit 100 also includes a tap setting override circuit (test circuit) 120 connected to provide control signals to shift register 108. The control signals include a bypass signal BY_PASS on line 122, a reset signal RESET on line 123 and tap position signals (TP0–TPN) on control lines 124. According to the teaching of the invention, test circuit 120 receives a testmode (TM) signal at line 126 and a plurality of input signals (A0–AX) via input lines 128.

In general, the DLL of FIG. 1 receives external clock signal XCLK to generate internal clock signal DLLclk. In most cases, the internal clock DLLclk has the same frequency with the external clock XCLK. However, since it is internally generated, the internal clock is more controllable. It also more accurately accounts for the variable operating condition of the device in which the DLL resides. Therefore the internal clock is often used in place of the external clock to perform timing calculation within integrated circuit.

Figure 2A:
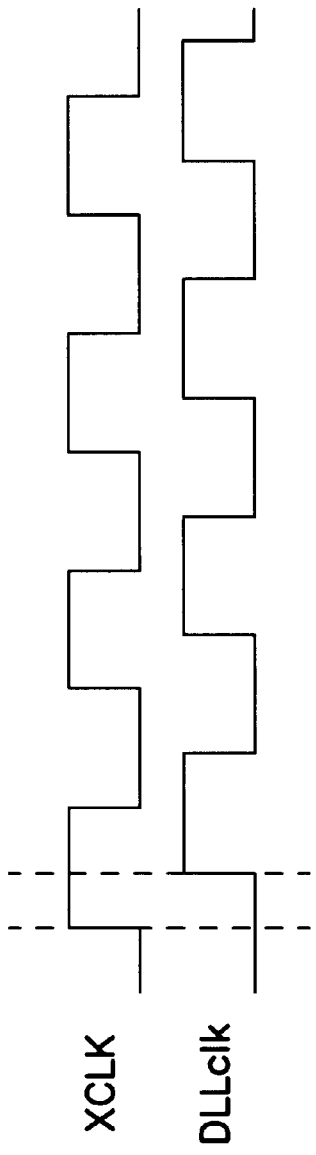
FIGS. 2A–C are timing diagrams showing signal relationships of clock signals of the DLL of FIG. 1.
Figure 2B:
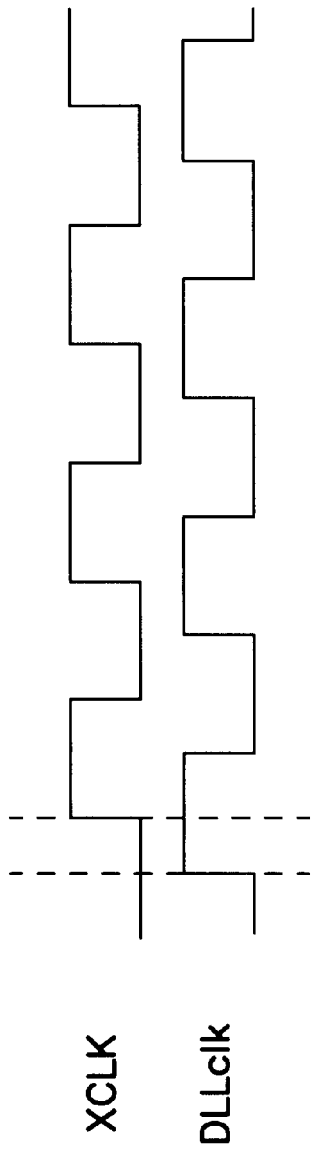
Figure 2C:
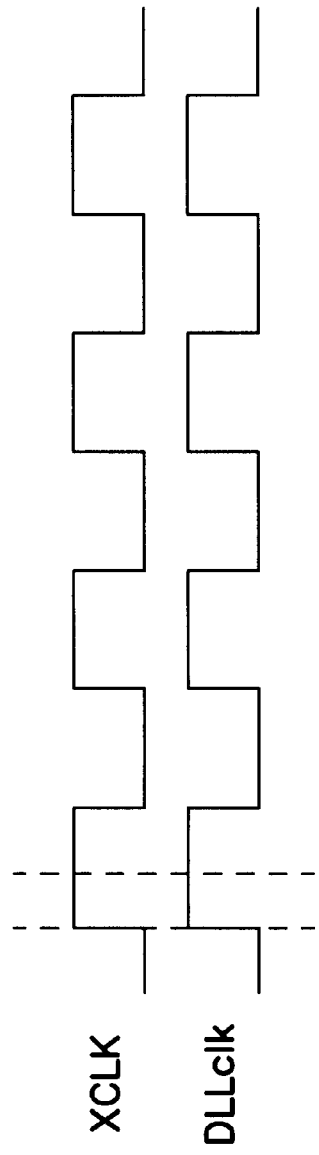

In operation, delay line 102 receives, at entry point X, external clock signal XCLK from node 104 and generates internal clock signal DLLclk at node 106. Path 111 indicates a path in which XCLK signal enters the delay line 102 at point X and travels to node 106 and becomes DLLclk signal. Model circuit 112 receives DLLclk signal to produce CLKfb signal and feeds it back to phase detector 116. Phase detector 116 compares the relative timing between the edges of XCLK and CLKfb signals and produces shifting signals SR and SL. When XCLK is leading CLKfb (as shown in FIG. 2A) phase detector 116 produces a SR signal, consequently, shift register 108 performs a shift right. When shifting right, the shift register selects one of the taps T0–TN to move point X to the right to decrease the amount of delay. In the opposite case, when XCLK is lagging CLKfb (as shown in FIG. 2B), phase detector 116 produces a SL signal, consequently, shift register 108 performs a shift left. When shifting left, the shift register selects one of the taps T0–TN to move point X to the left to increase the amount of delay. When XCLK and CLKfb signals are substantially synchronized (as shown in FIG. 2C), the DLL is locked.

Figure 3:
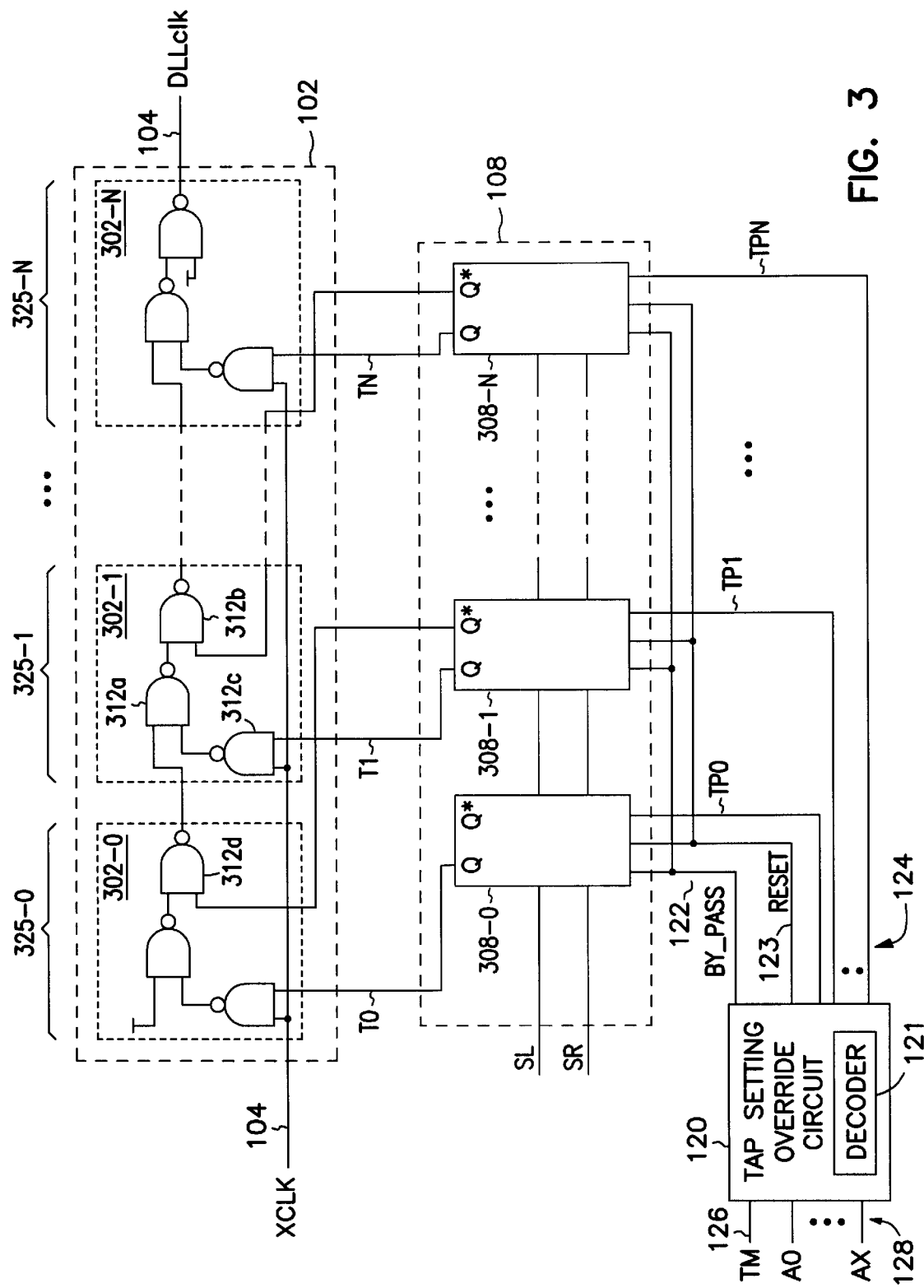
FIG. 3 is schematic diagram showing in more detail a portion of the DLL and the test circuit FIG. 1.

FIG. 3 is a schematic diagram showing in more detail a portion of DLL 101 and test circuit 120 of FIG. 1. In the Figure, delay line 102 includes a plurality of delay cells 302 0–N. Each of the delay cells includes a plurality of delay elements, such as NAND gates 312a, 312b and 312c of delay cell 302-1. The inputs of the NAND gates have a plurality of control inputs which are connected to receive control signals from shift register 108. Shift register 108 includes a plurality of register cells 308 0–N. Each of the register cells 308 0–N includes an output Q and a complementary output Q*.

Each output Q is connected to select one of the tap T0–TN. Each output Q* is connected to a previous delay cell. For example, output Q of register cell 308-1 is connected to tap T1 which is connected to delay cell 302-1. And output Q* of register cell 308-1 is connected to an input of a NAND gate 312d of a previous delay cell, such as delay cell 302-0. Furthermore, each of the delay cell 302 0–N connects to each of the register cell 308 0–N to form a delay stage. For example delay cell 302-0 combines with register cell 308-0 to form a delay stage 325-0, and delay cell 302-N combines with register cell 308-N to form a delay stage 325-N. Thus DLL 101 comprises a plurality of delay stages 325 0–N. The delay stages 325 0–N are controlled by register cells 308 0–N.

According to the teaching of the invention, test circuit 120 further includes a decoder 121. Decoder 121 receives inputs signals provided on input lines 128 and decodes the input signals such that each combination of the input signals corresponds to a position of each of the taps T0–TN.

Referring to the DLL of FIG. 3, any number of delay stages 325 0–N can be configured according to the current design of the DLL of the invention. Also, according to the teaching of the invention, delay stages 325 0–N can be configured with any desired set amount of delay. For example, in one embodiment, each of the delay stages (225 0–N) can be designed to have a 200 ps (picosecond) delay and the frequency of the external clock signal (XCLK) can be selected to be 100 MHz (megahertz) or 10 ns (nanosecond) clock cycle. Other delay values and external clock frequency configurations can similarly be configured. The invention is not so limited. If it is desired to delay the external clock signal by exactly one clock cycle (10 Ons), then the minimum number of delay stages is 50 (10 ns ÷200 ps =50). If the frequency is 250 MHz (4 ns clock cycle) then the minimum number of delay stages is 20 (4 ns÷200 ps =20). Therefore the minimum operating frequency is the inverse of the product of the number of delay stages and the delay per stage. From the example, a DLL having a delay line including 50 delay stages can be used with a minimum frequency of 100 MHz, assuming that the total delay covers a full clock cycle.

In operation, referring to FIG. 3, assuming that shift register 108 receives SL signal from the phase detector. One of the register cells 308 0–N is enabled to select a new entry point to the left of the current entry point (such as current entry point X in FIG. 1). If register cell 308-1 is enabled, a HIGH signal level will be at output Q which selects tap T1 and activates NAND gate 312c which allows XCLK signal to enter delay line 102 at this tap (T1) of delay stage (225-1). XCLK signal propagates from this entry point through the remaining delay stages to node 104. Meanwhile, since output signal at Q of register cell 308-1 is HIGH, Q* will have a LOW signal level which disables NAND gate 312d of previous delay stage, in this case delay stage 325-0. The process repeats until XCLK and CLKfb are substantially synchronized. When the XCLK and CLKfb are substantially synchronized, the DLL is locked.

In the description above, tap T1 is discussed for the purpose of illustrating the operation of the DLL. In reality, in the conventional DLL, it is impossible to know exactly which tap is being used. The selected tap could be the one next to tap T1, such as tap T0 or tap T2. This is because it is impossible to know how the operating conditions are affecting the DLL at a given time. Under one set of operating conditions, the DLL selects a certain tap. At another point in time, even with the same clock frequency, the DLL may select a different tap because the operating conditions may have changed due to changes in variables such as temperature, voltage and internal process variations.

Testing the DLL involves the same uncertainty described above. Throughout the test process, it is very difficult to predict which tap or tap settings are being used or if each tap setting is being tested. Although it might be possible to test the taps at various clock frequency settings, this is very cumbersome and still provides no guarantee that a particular tap was utilized or tested.

For these reasons, the novel test circuit 120 of the present invention provides a novel approach to test with accuracy each of the taps in DLL 101 of the invention. In FIG. 3, test circuit 120 receives testmode signal TM initiate a test to DLL 101. After receiving the TM signal, test circuit 120 activates bypass signal BY_PASS on line 122 which causes register cells 308 0–N to bypass or ignore any shifting signals (SR or SL) from phase detector 116 (shown in FIG. 1). Test circuit 120 then activates the RESET signal to reset all register cells 308 0–N to the same state. After all the register cells are reset, test circuit 120 activates control lines 124 to send one of the tap position signals TP0–TPN to select one of the register cells 308 0–N. The tap position signal changes the state of the selected register cell enabling a selection of a tap. The tap position signal is selected by decoding a combination from input lines 128. The combination of input signals A0–AX determines which position of the taps T0–TN is being selected for testing.

According to one teaching of the invention, the exact tap (or the position of the tap) being tested is identified. The number of input lines 128 of test circuit 120 can be selected such that each combination of the input lines can be decoded by decoder 121 and assigned to each of the taps T0–TN. The number of all possible combinations of the input signals at least equals to the total number of the taps. Thus if N is the number of taps (T0–TN) then X number of input signals (A0–AX) is $X=\text{Log}_2 N$, or $N=2^x$. For example, if there are 256 taps then there must be 256 combinations of inputs to cover all 256 taps, thus 8 inputs ($8=\text{Log}_2 (256)$ or $256=2^8$) are needed to obtain 256 combinations. If there are 32 taps then the number of inputs to cover 32 combination is 5 ($\text{Log}_2(32)$).

Tap T0–TN can be assigned such that T0 carries a 0 decimal value or in position 0, T1 is in position 1, and so on. For example, if A7 is the most significant bit and A0 is the least significant bit, to test a tap at position 0 (or T0 in the FIGS. 1 or 3), then the binary values for A7 to A0 at inputs 128 would be 00000000. To test tap T1, the inputs would be 00000001, for T2 it would be 00000010 and so on. Therefore, any tap of the taps T0 through TN can be selected as desired. Thus the exact tap can be selected during a test of the DLL. Since each of the tap T0–TN connects to one of the register cell 308 0–N, each unique combination of the input signals A0–AX is also assigned or corresponds to one register cell. Thus, when a register cell receives one of the tap position signal TP0–TPN, the register cell selects the corresponding tap connected to it.

Figure 4:
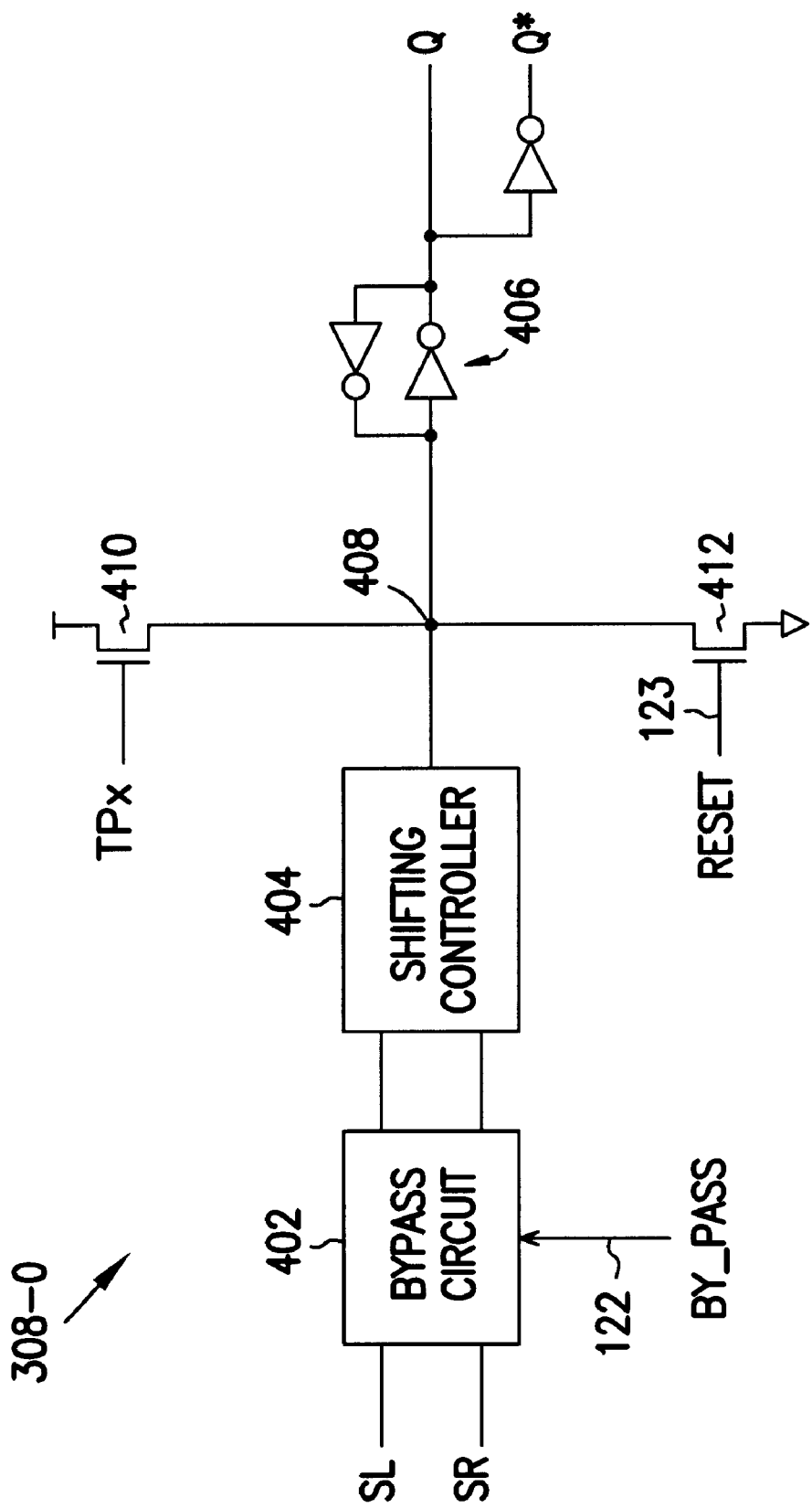
FIG. 4 is a schematic diagram of a register cell of the DLL of FIG. 3.

FIG. 4 is a schematic diagram of one of the register cells of the DLL of FIG. 3. In the Figure, register cell 308-0 includes a bypass circuit 402 connected to a shifting controller 404. Bypass circuit 402 receives the shifting signals SL and SR, and bypass signal BY_PASS on line 122. Shifting control 404 connects to a latch 406 at node 408. Latch 406 provides outputs Q and Q*. Node 408 also connects to a pullup transistor 410 and a pulldown transistor 412. Transistor 410 is controlled by tap position signal TPx. TPx represents one of the TP0–TPN signals shown in FIG. 3. Transistor 412 is controlled by the RESET signal on line 123.

In a test, BY_PASS signal disables the shifting signals SL and SR. Consequently, bypass circuit 402 causes shifting controller 404 to be inactive. When shifting controller 404 is inactive, node 408 is controlled by either the RESET or TPx signal through transistors 412 and 410, respectively. At the start of the test, test circuit 120 activates the RESET signal on line 123, which turns on transistor 412 forcing a low signal level (LOW) on node 408. This resets the state of register cell 308-0 to HIGH or logic one. Since all of the register cells 308 0–N are connected to the RESET signal, all of them are reset to the same state (one in this case). After all register cells 308 0–N are reset, test circuit 120 activates one of the tap position signals TP0–TPN to select a known. It is assumed tap at position 0 has been selected for the test. Thus, test circuit 120 activates the tap position signal corresponding to the tap at position 0. Since TP0 signal corresponds to tap at position 0, signal TP0 is activated. TP0 is also corresponds to register cell 308-0, thus, TPx of register cell 308-0 represents TP0. When TPx is activated, it turns on transistor 410 forcing a high signal level (HIGH) on node 408. This changes the state of register cell 308-0 to another state, which is LOW or logic zero in this case. When register cell 308-0 changes state during the test, it selects tap T0 for the test.

Figure 5:
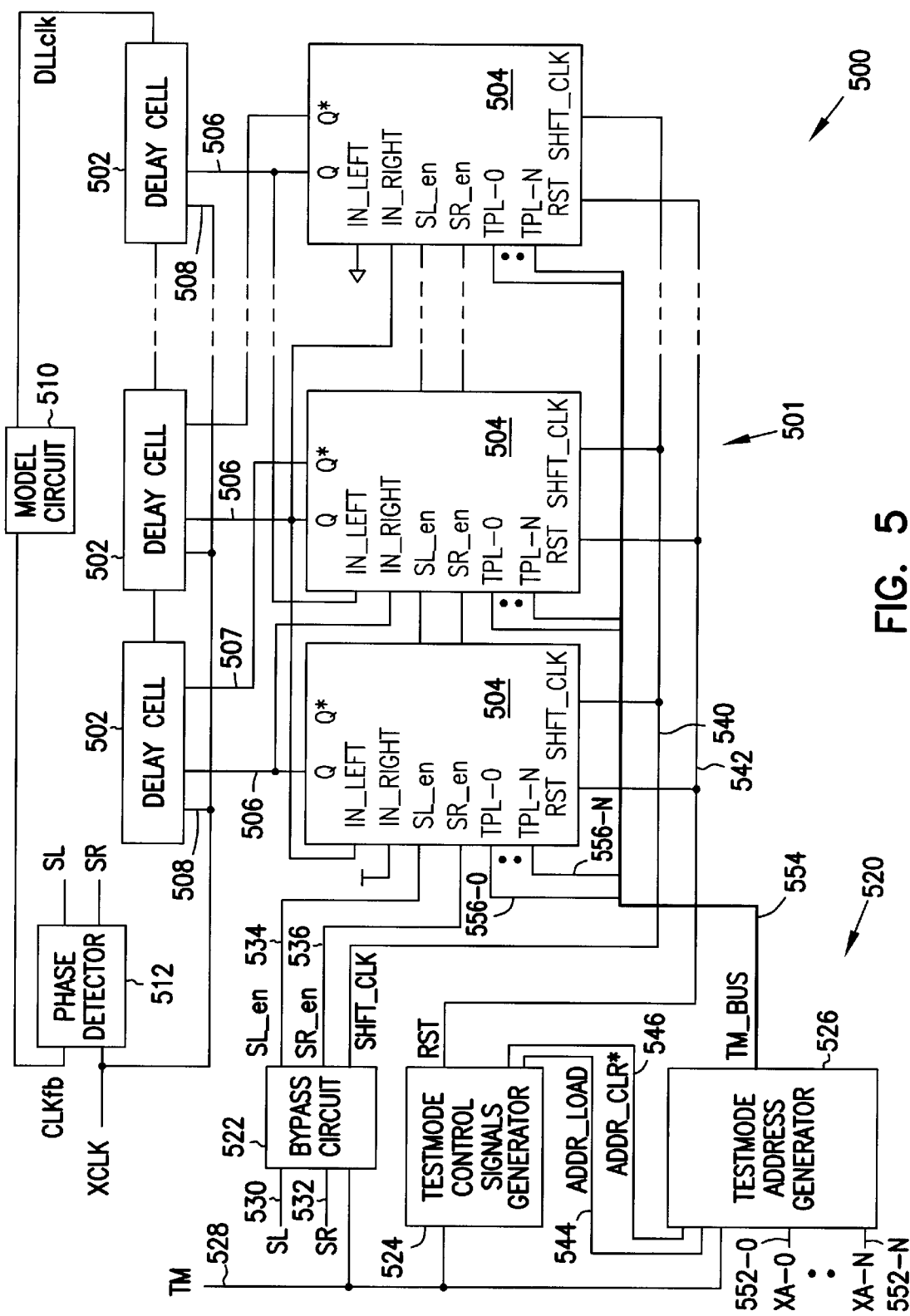
FIG. 5 illustrates a block diagram of an integrated circuit having a DLL and a test circuit according to another embodiment of the invention. Integrated circuit

FIG. 5 illustrates a block diagram of an integrated circuit 500 having a DLL 501 and a test circuit 520 according to another embodiment of the invention. DLL 501 includes a plurality of delay cells 502 connected to a plurality of register cells 504 via a plurality of taps 506. Each of the register cell includes outputs Q and Q*. Output Q is connected to tap 506, and output Q* is connected to an output line 507. Each of the delay cells 502 is constructed the same as each of the delay cells 302 0–N of FIG. 3. Each of the delay cells 502 is also connected to one of the register cells 504 in the same manner as delay cells 302 0–N of FIG. 3. That means output Q of a register cell 504 is connected to a delay cell 502 through tap 506, and output Q* is connected to another delay cell via output line 507. Delay cells 502 includes a plurality of inputs 508 to receive an external clock signal XCLK at one of the inputs 508. Delay cells 502 generate an internal clock signal DLLclk. A model circuit 510 receives the DLLclk signal and produces a feedback signal CLKfb. A phase detector 512 receives the XCLK and CLKfb signals and generates shifting signals. The shifting signals include a shift left (SL) signal and a shift right signal (SR).

Test circuit 520 include a bypass circuit 522, a testmode control signals generator 524 and a testmode address generator 526. Bypass circuit 522 receives an external testmode signal TM on line 528 and the SL and SR signals from phase detector 512 on line 530 and 532. Bypass circuit 522 generates a shift left enable signal SL_en on line 534, a shift right enable signal SR_en on line 536 and a shift clock signal SHFT_CLK on line 540. The SL_en, SR_en and SHFT_CLK signals are provided to each of the register cells 504. Testmode control signals generator 524 receives the testmode signal TM and generates a reset signal RST on line 542, an address load signal ADDR_LOAD on line 544 and an address clear signal ADDR_CLR* 546. The reset signal is provided to each of the register cells 504 during a test mode. Testmode address generator 526 receives the TM signal, the ADDR_LOAD, ADDR_CLR*, and a plurality of input signals or address signals XA 0–N on input pins or lines 552 0–N. Testmode address generator 526, in response to the input signals XA 0–N, generates a plurality of testmode address signals TM_A0, TM_A0* through TM_AN, TM_AN*. The testmode address signals TM_A0–TM_AN* are the true and complement signals of input signals XA 0–N. The TM_A0–TM_AN* signals are provided to a testmode bus TM_BUS 554. Bus 554 is connected to each of the register cell 504 through a plurality of tap position lines 556 0–N, which provides tap position signals TPL 0–N. Each of the register cells 504 is encoded with a predetermined encoding scheme. The encoding scheme allows the tap position lines 556 0–N from each register cell to select a unique combination from the TM_A0–TM_AN* signals provided on bus 554.

In a test mode, to test a particular tap 506, a combination of input signals XA 0–N is chosen. This combination will select one register cell 504, which connects to a tap being tested. At the beginning of the test, bypass circuit 520 receives the testmode TM signal and causes register cells 504 to bypass shifting signals SL_en and SR_en. Register cell 504, instead, receives signals from testmode control signals generator 524 and testmode address generator 526. Testmode control signal generator 524 activates the reset signal RST on line 542, which resets all register cells 504 to the same state. In the mean time, testmode address generator 526 receives input signals XA 0–N on input lines 552 0–N. At a predetermined time, the ADDR_LOAD signal enables testmode address generator 526 to generate testmode address signals TM_A0–TM_AN* and provide them on bus 554. Since each of the register cells 504 can select only one combination of signals from the TM_A0–TM_AN* signals, only one register cell is selected. When a register cell is selected, the tap 506 corresponding to that register is selected. Thus, any known tap can be selected with this scheme.

Figure 6:
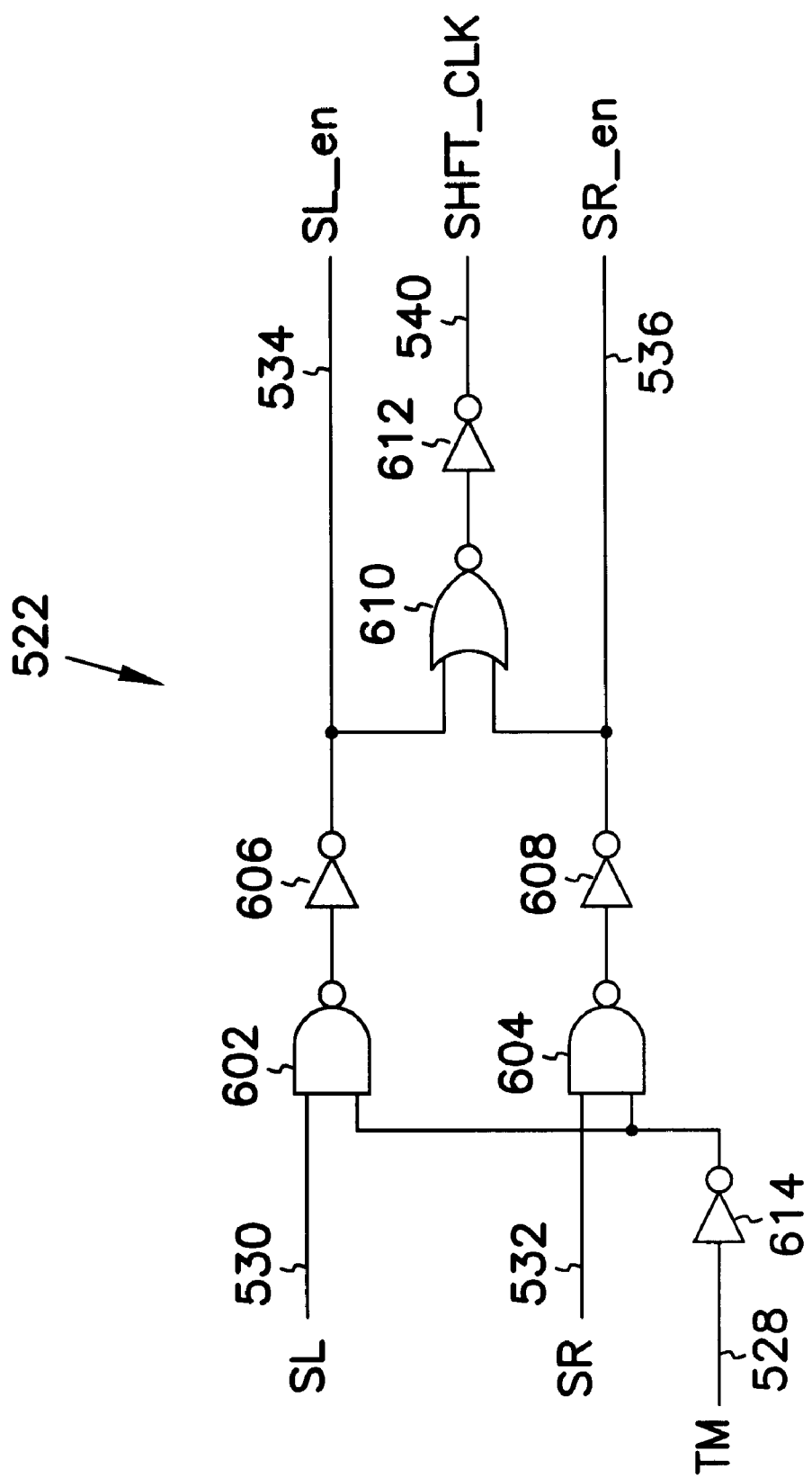
FIG. 6 illustrates a schematic diagram of a bypass circuit of the test circuit of FIG. 5.

FIG. 6 illustrates a schematic diagram of the bypass circuit of FIG. 5. Bypass circuit 522 includes NAND gates 602 and 604. The output of NAND gate 602 provides an input to an inverter 606, which produces the SL_en signal at its ouput on line 534. The output of NAND gate 604 provides an input to an inverter 608, which produces the SR_en signal at its ouput on line 536. The outputs of inverters 606 and 608 provide inputs to a NOR gate 610. The output of NOR gate 610 provides an input to an inverter 612, which produces the SHFT_CLK signal at its output on line 540. NAND gates 602 and 604 receive signals SL and SR on lines 530 and 532, respectively. Both NAND gates 602 and 604 also receive the testmode signal TM on line 528 through an inverter 614.

During a normal DLL operation, TM signal is not asserted (not activated or disabled). Thus, the SL or SR signal on lines 530 or 532 is activated (or enabled) and is sent to register cells 504 as SL_en or SR_en. The SHFT_CLK signal is also activated (or enabled) and is sent to register cells 504. During a test, the TM signal is asserted (activated or enabled). When the TM is activated, SL_en, SR_en and SHFT_CLK signals are disabled (deactivated). Thus, signal SL or SR provided from phase detector 512 does not affect register cells 504. In other words, the SL and SR signals from phase detector 512 are bypassed when the testmode signal TM is activated. Register cells 504, instead, receive signals from testmode control signals generator 524 and testmode address generator 526.

Figure 7A:
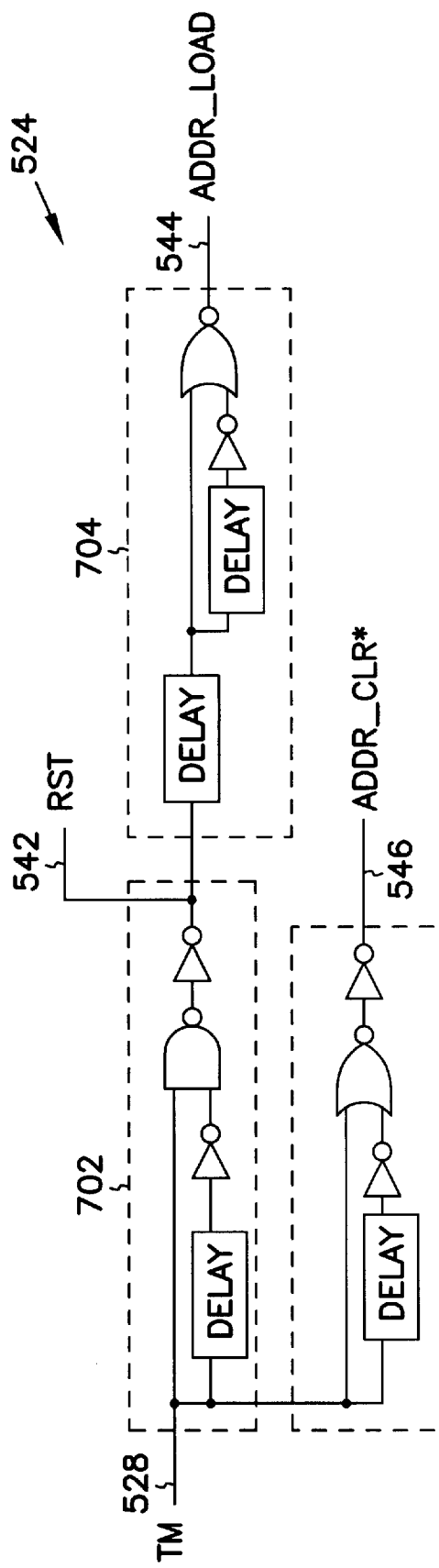
FIG. 7A illustrates a schematic diagram of a testmode control signals generator of the test circuit of FIG. 5.

FIG. 7A illustrates a schematic diagram of the testmode control signals generator of FIG. 5. Testmode control signals generator 524 includes a first pulse generator 702 to generate the reset RST signal on line 542, a second pulse generator 704 to generate the ADDR_LOAD signal on line 544, and a third pulse generator 706 to generate the ADDR_CLR* signal on line 546. Testmode control signals generator 524 receives the TM signal on line 528.

Figure 7B:
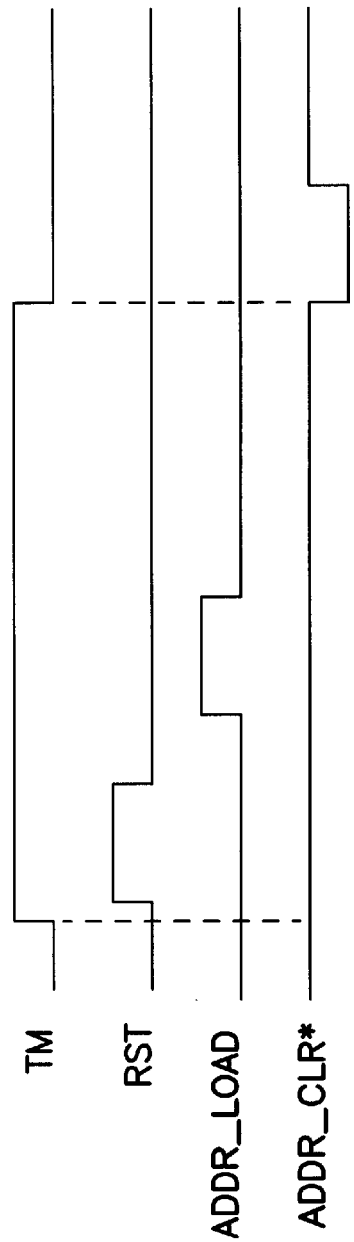
FIG. 7B is a timing diagram of the testmode control signals generator of FIG. 7A.

FIG. 7B is a timing diagram of the testmode control signals generator of FIG. 7A. At the beginning of a test, TM signal transitions HIGH, which generates positive pulse signals RST and ADDR_LOAD. When TM signal transitions LOW at the end of the test, a negative pulse signal ADDR_CLR* is generated. The reset RST signal resets the state of all register cells 504 (FIG. 5) to the same state before ADDR_LOAD is activated. In one embodiment, the reset signal resets all register cells 504 to a high signal level (HIGH) or ones. The ADDR_LOAD signal enables testmode control signals generator 524 to sample input signals XA 0–N (FIG. 5) to generate the testmode address signals TM_A0–TM_AN*. The ADDR_CLR* signal resets the TM_A0–TM_AN* signals to a known state at the end of the test.

Figure 8:
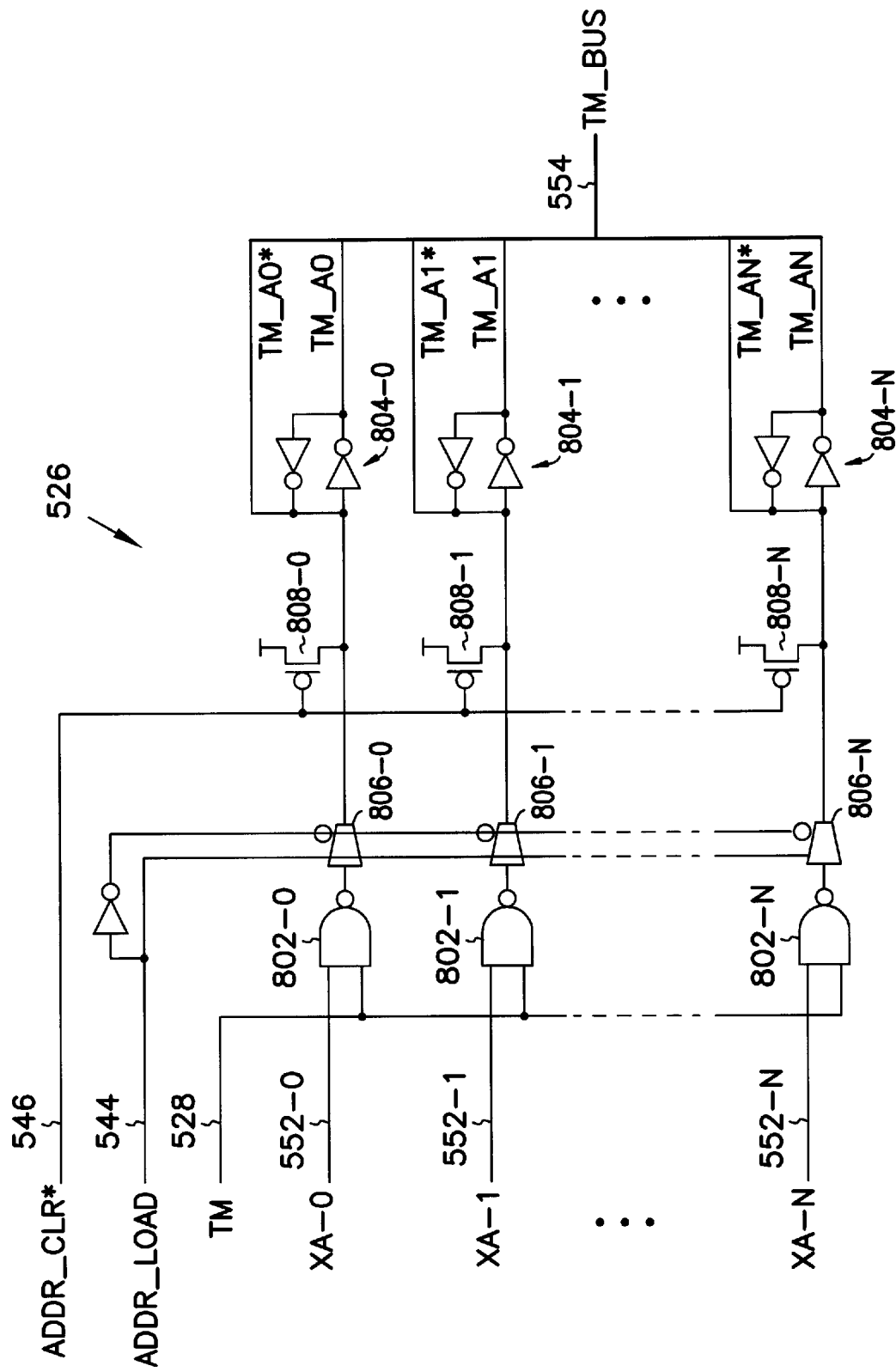
FIG. 8 illustrates a schematic diagram of a testmode address generator of the test circuit of FIG. 5.

FIG. 8 illustrates a schematic diagram of the testmode address generator of FIG. 5. Testmode address generator 526 receives the ADDR_CLR* signal on line 546, the ADDR_LOAD signal on line 544, the testmode signal TM on line 528 and the input signals XA 0–N on lines 552 0–N. Testmode address generator 526 includes a plurality of NAND gates 802 0–N. NAND gates 802 connects to a plurality of latches 804 0–N through a plurality of multiplexors (MUX) 806 0–N. Latches 804 0–N provide a plurality of testmode address signals TM_A0, TM_A0*, which represent the true and complement signals of input signals XA 0–N. The TM_A0–TM_AN* signals are provided on TM_BUS 554. In addition, a plurality of pullup transistors 808 0–N are connected between MUX 806 0–N and latches 804 0–N. The ADDR_CLR* signal provides input signals to the gates of transistors 808 0–N to reset the TM_A0–TM_AN* signals to a known state at the end of a test.

In operation, NAND gates 802 0–N receive input signals XA 0–N on lines 552 0N. When testmode TM signal is activated (transitioning HIGH), the XA 0–N signals are allowed to pass through NAND gates 802 0–N. At a predetermined time, ADDR_LOAD signal enables MUX 806 0–N to allow the XA 0–N signals to pass through MUX 806 0–N to latches 804 0–N and become the TM_A0–TM_AN* signals. The TM_A0–TM_AN* signals are the true and complement signals of the XA 0–N signals. The TM_A0–TM AN* signals are provided on bus 554 and sent to register cells 504.

Figure 9:
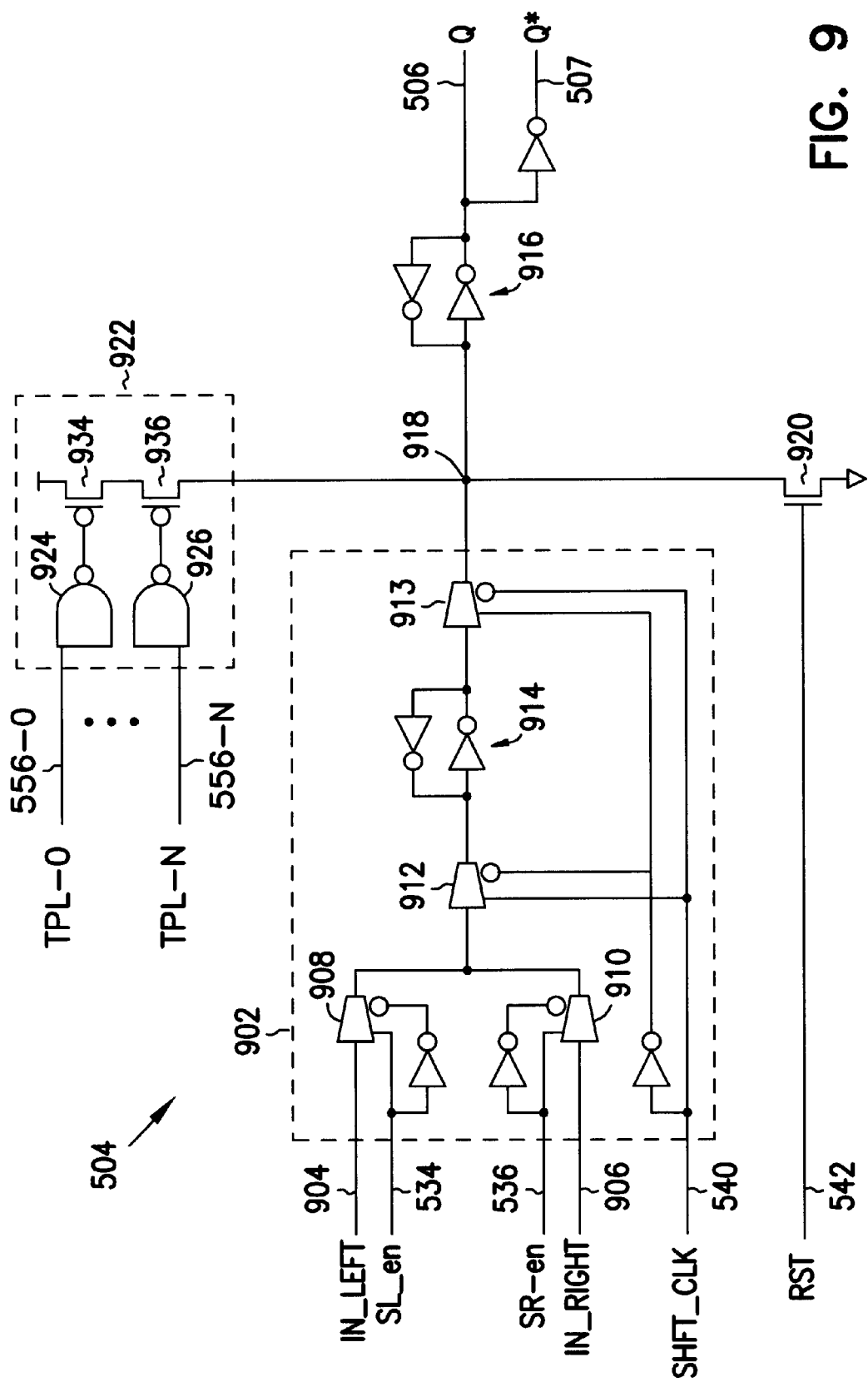
FIG. 9 is a schematic diagram of a register cell of the DLL of FIG. 5.

FIG. 9 illustrates a schematic diagram of the register cell of FIG. 5. Register cell 504 includes a controller 902. Controller 902 receives an IN_LEFT signal on line 904, and IN_RIGHT signal on line 906, the SL_en signal on line 534, the SR_en signal on line 536 and the SHFT_CLK signal on line 540. The IN_LEFT signal provides an input to a multiplexor 908, which is controlled by signal SL_en. The IN_RIGHT signal provides an input to a multiplexor 910, which is controlled by signal SR_en. SHFT_CLK signal provides control to multiplexors 912 and 913, which allow the passage of the IN_LEFT or the IN_RIGHT signal through a latch 914. Controller 902 connects to a latch 916 at node 918. Latch 916 provides outputs Q and Q*. Output Q connects to tap 506 and output Q* connects to ouput line 507. Node 918 is connected to a pulldown transistor 920, which receives the reset signal RST at its gate on line 542. Node 918 is also connected to a pullup circuit 922. Pullup circuit 922 includes NAND gates 924 and 926, and transistors 934 and 936. The inputs of NAND gates 924 and 926 are connected to tap position lines 556 0–N to receive a combination of tap position signals TPL 0–N. The TPL 0–N signals represent a unique combination of signals selected from the testmode address signals TM_A0–TM_AN*.

In a test mode, the SL_en and SR_en and SHFT_CLK signals are disabled because TM signal (FIG. 6) is activated or asserted HIGH. Thus, in the test mode, controller circuit 902 is not active, therefore node 918 is controlled by TPL 0–N and RST signals through pulldown transistor 920 and pullup circuit 922, respectively. In the test mode, the signal RST is generated after the TM signal transitioning HIGH (FIG. 7B). In FIG. 9, the RST signal turns on transistor 920, which pulls node 918 to ground (zero) or LOW. Since all of the register cells 504 receives the RST signal, they all are reset to the same state (one in this case.) When node 918 is LOW, output Q is HIGH and output Q* is LOW. When output Q is HIGH none of the taps 506 (FIG. 5) is selected.

After all of the register cells are reset to the same state (zeros at node 918), the RST signal transitions LOW (FIG. 7B) turning transistor 920 off. Node 918 is now controlled by signals TPL 0–N of pullup circuit 922. After the RST signal transitions low, the ADDR_LOAD signal (FIG. 6B) is activated, which allows input signals XA 0–N (FIG. 8) to propagate through MUX 806 0–N to latches 804 0–N. Latches 704 0–N provide signals TM A0–TM_AN* on bus 554. In FIG. 9, tap position lines 556 0N, select a unique combination of signals from the TM_A0–TM_AN* signals on bus 554. The unique combination of signals is represented by tap position signals TPL 0–N, which provide inputs to NAND gates 924 and 926. Since each of the register cells 504 is encoded to select only a unique combination signals from the TM_A0–TM_AN* signals, only one combination of the TPL 0–N signals affects one of the register cells 504.

In FIG. 9, when lines 556 0–N select the unique combination, signals TPL 0–N are all at a high level signal (HIGH) or all ones. When TPL 0–N are all HIGH, both outputs of NAND gates 924 and 926 are LOW, which turn on both transistors 934 and 936. When both transistors 934 and 936 are on, node 918 is pulled up to a high voltage level (HIGH) changing the state of register cell 504. In this case, the state of only one register cell 504 is changed because of the encoding scheme. Thus only one of the tap 506 is selected by output Q.

Figure 10:
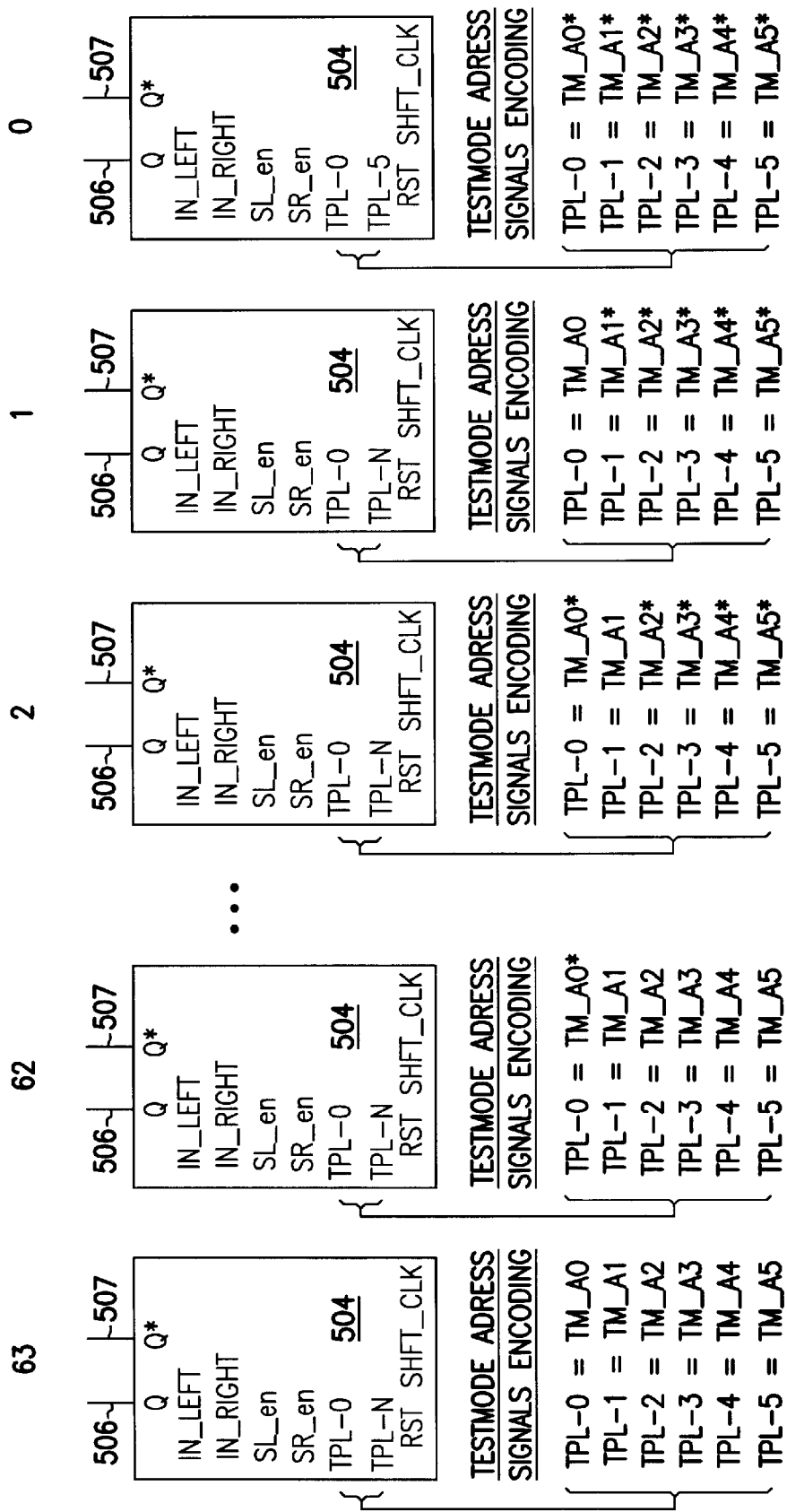
FIG. 10 is a block diagram illustrating an encoding scheme of register cells of the DLL of FIG. 5.

FIG. 10 is a block diagram illustrating an encoding scheme of the register cells of the DLL of FIG. 5. As shown in the Figure, the encoding scheme allows for the unique selection of one register cell 504 for each combination of the testmode address signals TM_A0–TM_AN*. For simplicity, FIG. 10 shows the encoding scheme with N equals 5 and register cells are numbered from position 0 to 63. With this encoding scheme, any register cell can be selected by choosing the encoded combination corresponding to that register cell. Consequently, any known tap 506 can be selected for the test. For example, to test tap 506 at position 2, the input signal XA 0–5 signals (FIG. 5 or 7) should be represented in binary form as 010000 (XA-0=0, XA-1=1, XA2-2=0. . . .) To test tap 507 at position 62, XA 0–5 should be 100000. Thus, with the encoding scheme of FIG. 10, any tap 506 can be selected by choosing the right combination of input signals XA 0–N.

Figure 11:
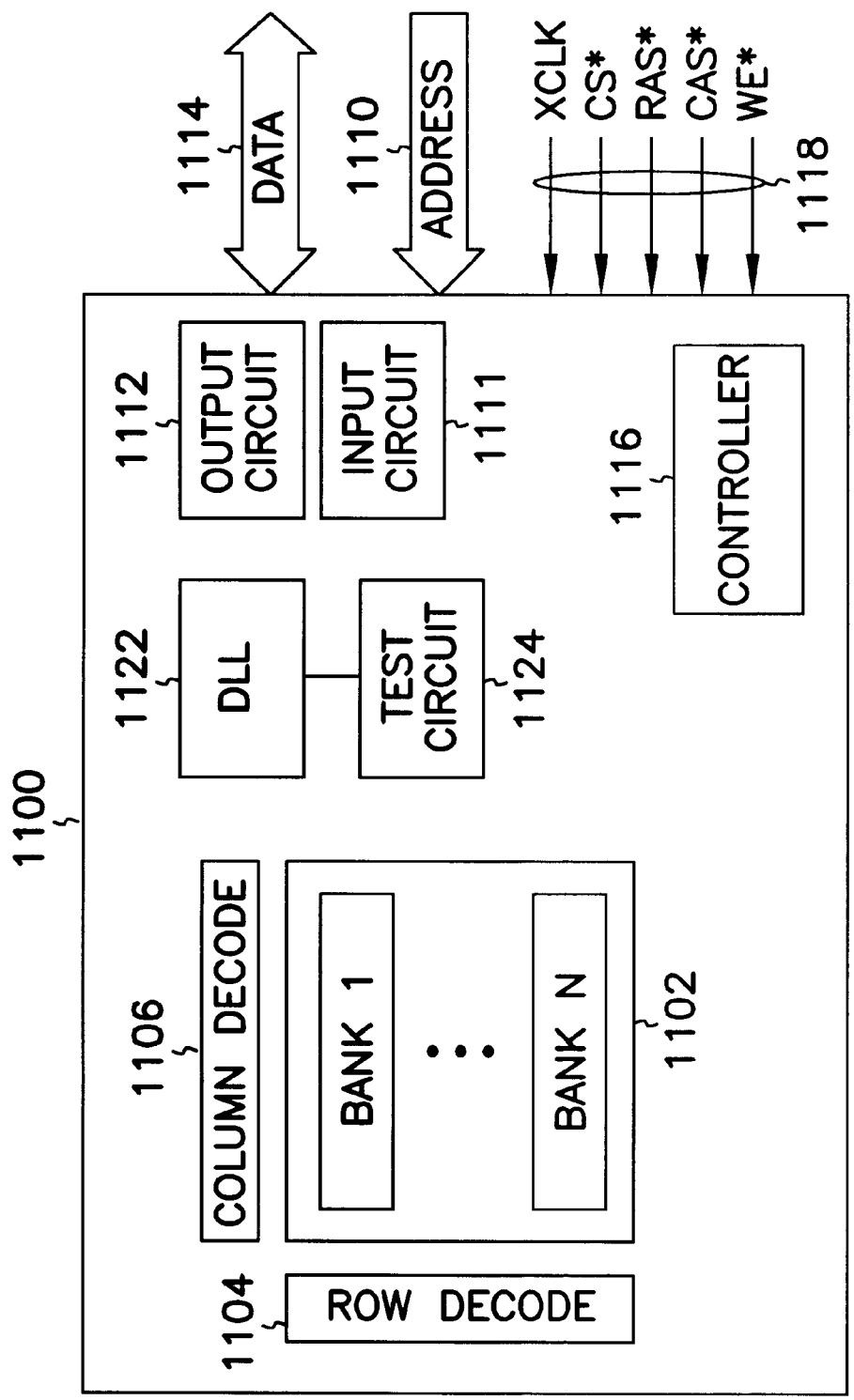
FIG. 11 is memory device according to one embodiment of the invention.

FIG. 11 is a simplified block diagram of a memory device 1100 according to one embodiment of the invention. In one embodiment, memory device 1100 includes a main memory 1102. Main memory 1102 typically includes dynamic random access memory (DRAM) devices which include one or more memory banks, indicated by BANK 1–N. Each of the memory banks BANK 1–N includes a plurality of memory cells arranged in rows and columns. Row decode 1104 and column decode 1106 access individual memory cells in the rows and columns in response to an address, provided on address bus or address lines 1110 (ADDRESS). An input circuit 1111 and an output circuit 1112 connect to a data bus 1114 (DATA) for bi-directional data communication with main memory 1102. A memory controller 1116 controls memory 1100 responding to control signals provided on control lines 1118. The control signals include, but are not limited to, an input clock signal (XCLK), Chip Select (CS*), Row Access Strobe (RAS*), Column Access Strobe (CAS*), Write Enable (WE*).

It will be appreciated by those skilled in the art that the memory device 1100 of FIG. 11 can include additional circuitry and control signals, and that the memory device of FIG. 11 has been simplified to help focus on the invention. According to the teaching of the invention, memory device 1100 further includes a DLL 1122 connected to a test circuit 1124. DLL 1122 and test circuit 1124 can be constructed and operated as DLL 111 and test circuit 120 or DLL 401 and test circuit 420, which were described and discussed in more detail in connection with FIGS. 1–9. In one embodiment, such as the embodiment of FIG. 3, test circuit 1124 represents test circuit 120; thus, address lines 1100 represent address lines 128, which receive signals A0–AX to produce a tap position signal (TP0–TPN) to test the DLL during a test mode. In another embodiment, such as the embodiment of FIG. 5, test circuit 1124 represents test circuit 520 of FIG. 5; thus address lines 1100 represent address lines 552 0–N, which receive signals XA 0–N to produce a unique combination of signals (TPL 0–N) to test the DLL during a test.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

Figure 12:
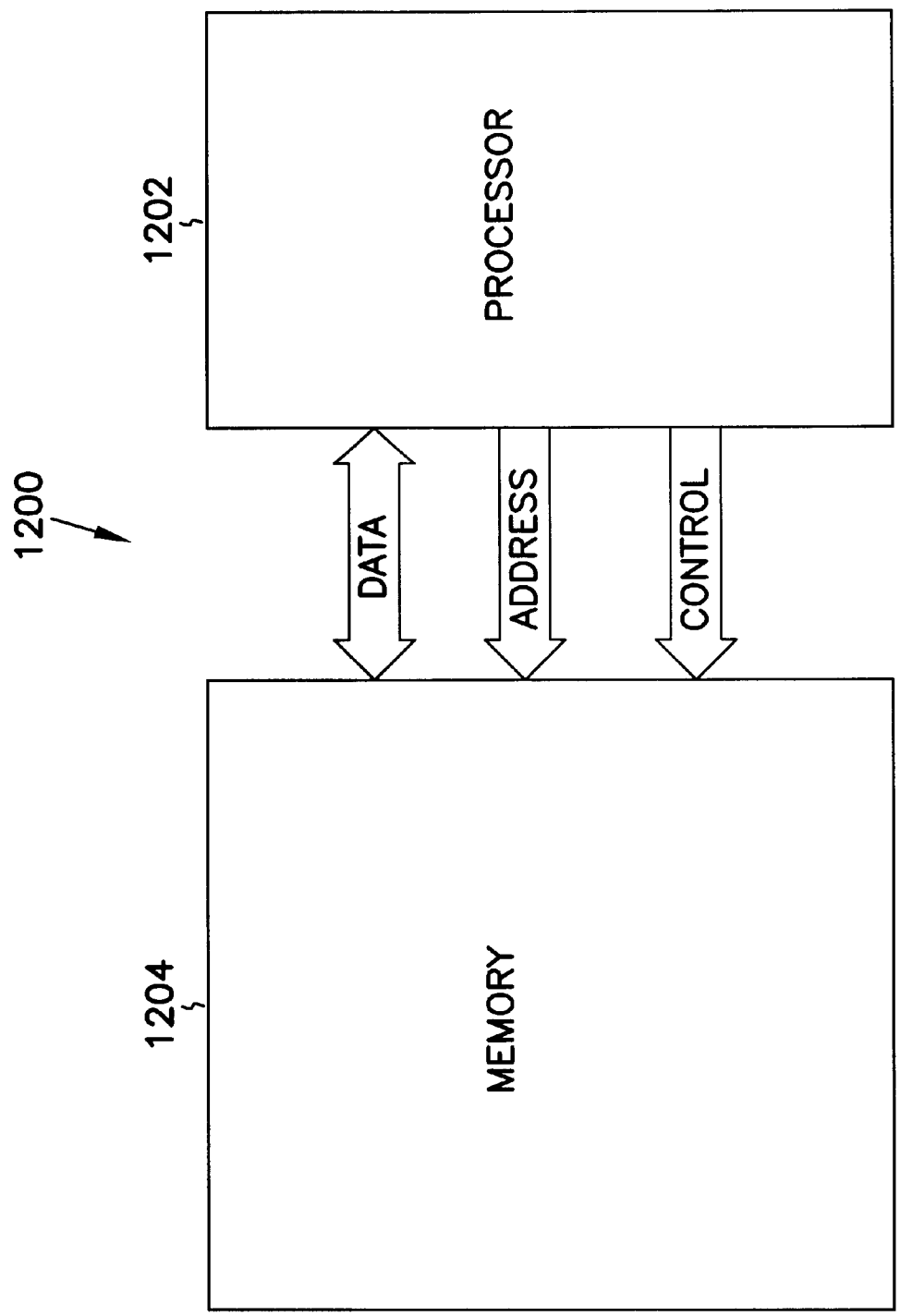
FIG. 12 is system according to one embodiment of the invention.

FIG. 12 illustrates a system according to the invention. In the Figure, system 1200 includes a processor 1202 connected to a memory device 1204. Memory device 1204 includes the embodiments of the DLL and the test circuit of the invention described above in FIGS. 1–9. According to the invention, processor 1202 provides control signals to memory device 1204 via control lines (CONTROL). Data communication between the processor and the memory is transmitted via data lines (DATA), and addresses are provided to the memory via address lines (ADDRESS). In one embodiment, processor 1202 and memory device can be fabricated on a single chip. Conclusion A test circuit for a delay locked loop (DLL) testability is provided which accurately and efficiently tests delay line taps of the DLL.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An integrated circuit comprising:
   a delay locked loop (DLL) comprising a plurality of taps and a register connected to the taps for selecting the taps in response to shifting signals; and
   a test circuit connected to the delay locked loop, wherein the test circuit is able to select any tap,bypassing the shifting signals, to test the DLL.

2. The integrated circuit according to claim 1, wherein the register comprises a plurality of register cells connected to the taps.

3. The integrated circuit according to claim 2, wherein the test circuit includes a plurality of input lines to receive a plurality of input signals, wherein each unique combination of the input signals causes a unique register cell to select a known tap to test the DLL.

4. An integrated circuit comprising:
   a delay locked loop (DLL) comprising a plurality of taps and a register capable of selecting the taps based on shifting signals; and
   a test circuit connected to the delay locked loop, wherein the test circuit sends a tap position signal to the delay locked loop during a test to select a tap, bypassing the shifting signals to test the DLL.

5. The integrated circuit according to claim 4, wherein, the test circuit includes:
   a plurality of input lines for receiving a plurality of input signals; and
   a decoder for decoding a combination of the input signals to produce the tap position signal.

6. The integrated circuit according to claim 5, wherein the number of all possible combinations of the input signals received at the input lines at least equals the total number of the taps.

7. An integrated circuit comprising:
a delay locked loop (DLL) comprising a plurality of taps; and
a test circuit connected to the delay locked loop, wherein the test circuit is able to select any tap to test the DLL, wherein the DLL further includes:
a phase detector to provide shifting signals; and
a shift register connected to the phase detector, wherein the shift register bypasses shifting signals received from the phase detector during the test and selects a tap based on the tap position signal.

8. An integrated circuit comprising:
a delay locked loop (DLL) including a plurality of taps, a shift register connected to the taps, and a phase detector connected to provide shifting signals to the shift register; and
a test circuit connected to the shift register, wherein the test circuit sends control signals to the shift register during a test to enable the shift register to bypass the shifting signals to select a known tap for testing the DLL.

9. The integrated circuit according to claim 8, wherein the test circuit includes a plurality of input lines to receive a plurality of input signals, wherein the input signals are decoded by the test circuit to produce the tap position signal to select a tap, wherein a unique combination of the input signals can be pre-selected to select a position of a known tap.

10. The integrated circuit according to claim 9, wherein the number of all possible combinations of the input signals received at the input lines at least equals the total number of the taps.

11. An integrated circuit comprising:
a plurality of delay stages;
a plurality of register cells connected to the delay stages through a plurality of taps for selecting the delay stages in response to shifting signals; and
a test circuit connected to the register cells, wherein the test circuit sends a tap position signal to a pre-selected register cell to test a tap connected to the pre-selected register cell, bypassing the shifting signals, during a test.

12. The integrated circuit according to claim 11, wherein the test circuit includes a plurality of input lines to receive a plurality of input signals, wherein the input signals are decoded by the test circuit to produce the tap position signal, wherein the tap position signal corresponds to only one position of a tap.

13. The integrated circuit according to claim 12, wherein the number of all possible combinations of the input signals received at the input lines at least equals the total number of the taps.

14. An integrated circuit comprising:
a delay lock loop (DLL) including a plurality of taps connected to a plurality of register cells, the register cells capable of selecting the taps based on shifting signals; and
a test circuit connected to the DLL, the test circuit producing a plurality of testmode address signals, wherein a unique combination of the testmode address signals enables a unique register cell to select a tap bypassing the shifting signals, to test the DLL.

15. The integrated circuit according to claim 14, wherein the test circuit includes a plurality of input lines to receive a plurality of input signals, wherein the testmode address signals are true and complement signals of the input signals.

16. An integrated circuit comprising:
a delay lock loop (DLL) including a plurality of taps connected to a plurality of register cells; and
a test circuit connected to the DLL, the test circuit producing a plurality of testmode address signals, wherein a unique combination of the testmode address signals enables a unique register cell to select a tap to test the DLL, wherein the DLL further includes a phase detector, the phase detector providing shifting signals the register cells, wherein in a test, the test circuit sends a bypass signal to the DLL to cause the register cells to bypass the shifting signals.

17. An integrated circuit comprising:
a delay lock loop (DLL) including a plurality of taps connected to a plurality of register cells; and
a test circuit connected to the DLL, the test circuit producing a plurality of testmode address signals, wherein a unique combination of the testmode address signals enables a unique register cell to select a tap to test the DLL, wherein the test circuit further includes a reset signal, wherein at the beginning of a test, the reset signal resets the register cells to the same state, and wherein during the test, one of the register cells changes from one state to another state.

18. An integrated circuit comprising:
a delay locked loop (DLL) including a plurality of taps, and a register to select the taps based on shifting signals; and
a test circuit comprising:
a bypass circuit connect to the DLL;
a testmode control signals generator connected to the DLL; and
a testmode address generator connected to the DLL for generating an address, wherein the test circuit is able to select any tap based on the address and bypassing the shifting signals to test the DLL.

19. The integrated circuit according to claim 18, wherein the register includes a plurality of register cells connected to the tap, and a phase detector connected to provide shifting signals to the register cells.

20. The integrated circuit according to claim 19, wherein the testmode address generator receives a plurality of input signals to generate a plurality of testmode address signals, wherein each unique combination of the testmode address signals is encoded to a unique register cell.

21. An integrated circuit comprising:
a delay locked loop (DLL) including a plurality of taps connected to a plurality of register cells; and
a test circuit comprising:
a bypass circuit connect to the DLL;
a testmode control signals generator connected to the DLL; and
a testmode address generator connected to the DLL, wherein the test circuit is able to select any tap to test the DLL, wherein the bypass circuit causes the register cells to bypass the shifting signals from the phase detector during a test of the DLL.

22. An integrated circuit comprising:
a delay locked loop (DLL) including a plurality of taps connected to a plurality of register cells; and
a test circuit comprising:
a bypass circuit connect to the DLL;
a testmode control signals generator connected to the DLL; and
a testmode address generator connected to the DLL, wherein the test circuit is able to select any tap to test the DLL, wherein the testmode control signals generator generates a reset signal to reset the register cells to the same state at the beginning of a test.

23. A memory comprising:
   address lines for receiving input signals;
   a delay lock loop (DLL) including a plurality of taps capable of being selected in response to shifting signals; and
   a test circuit connected to the address lines and the DLL, wherein the test circuit decodes a combination of the input signals received at the address lines to produce a tap position signal to select a tap, bypassing the shifting signals, to test the DLL during a test.

24. The memory according to claim 23, wherein the DLL further includes:
   a phase detector to provide the shifting signals; and
   a shift register connected to the phase detector, wherein the shift register bypasses shifting signals received from the phase detector during the test and selects a tap based on the tap position signal.

25. The memory according to claim 23, wherein the test circuit includes a decoder to decode the input signals to produce the tap position signal.

26. The memory according to claim 23, wherein the number of all possible combinations of the input signals received at the address lines at least equals the total number of the taps.

27. A system comprising:
   a processor;
   a memory connected to the processor, the memory comprising:
      address lines for receiving input signals;
      a delay lock loop having a plurality of taps, and a register for selecting the taps based on shifting signals; and
      a test circuit connected to the address lines and the delay lock loop, wherein the test circuit decodes a combination of the input signals received at the address lines to produce a tap position signal, wherein the tap position signal enables the delay locked loop to select a known tap, bypassing the shifting signals, to test the DLL during a test.

28. The system according to claim 27, wherein the test circuit includes a decoder to decode the input signals to produce the tap position signal.

29. The system according to claim 27, wherein the number of all possible combinations of the input signals received at the address lines at least equals the total number of the taps.

30. A method of testing a delay locked loop, the method comprising:
   initiating a testmode signal;
   decoding a combination of input signals to produce a tap position signal, the tap position signal corresponding to a known position of a tap;
   sending the tap position signal to a register cell connected to the tap;
   bypassing shifting signals sent to the register; and
   enabling the register cell to select the tap to test the DLL.

31. A method of testing a delay locked loop (DLL), the method comprising:
   assigning position numbers to a plurality of taps;
   receiving input signals at address lines;
   decoding the input signals to produce a tap position signal;
   sending the tap position signal to a shift register;
   bypassing shifting signals sent to the shift register; and
   selecting a tap corresponding to the tap position signal, bypassing the shifting signals, to test the DLL.

32. A method of testing a delay locked loop, the method comprising:
   activating a testmode signal;
   activating a bypass signal to cause a shift register to bypass shifting signals from a phase detector;
   decoding a plurality of input signals to produce a tap position signal; and
   enabling the shift register to select a tap based on the tap position signal to test the DLL.

33. The method according to claim 32 further comprises decoding a combination of input signals to produce the tap position signal.

34. A method of testing a delay locked loop, the method comprising:
   activating a testmode signal;
   bypassing shifting signals sent to a plurality of register cells;
   resetting the register cells to the same state; and
   producing a unique combination of tap position signals to change a known register cell corresponding to the unique combination of tap position signals to the to a different state, wherein the different state enables the known register cell to select a known tap for testing.

35. A method of testing a delay locked loop, the method comprising:
   activating a testmode signal;
   resetting a plurality of register cells to the same state;
   producing a combination of tap position signals to change a known register cell corresponding to the unique combination of tap position signals to the to a different state, wherein the different state enables the known register cell to select a known tap for testing, wherein producing a combination of tap position signals including:
      selecting a combination of input signals corresponding to a predetermined encoding scheme;
      producing a plurality of testmode address signals, the testmode address signals representing true and complement signals of the input signals; and
      selecting a unique combination of signals from the testmode address signals to produce the combination of tap position signals.

36. A method of testing a delay locked loop, the method comprising:
   encoding a plurality of register cells with a predetermined encoding scheme;
   receiving a plurality of input signals;
   producing a plurality of testmode address signals from the input signals;
   selecting a unique combination of the testmode address signals;
   selecting a register cell based on the combination of the testmode address signals;
   bypassing shifting signals sent to the register cell; and
   selecting a tap connected to the register cell for testing.

\* \* \* \* \*